United States Patent [19]

Carlson

[11] 4,324,679

[45] Apr. 13, 1982

[54] CONTROLLING ODOR IN PHOTOPOLYMERIZATION

[75] Inventor: Robert C. Carlson, Hudson, Wis.

[73] Assignee: Minnesota Mining and Manufacturing Company, St. Paul, Minn.

[21] Appl. No.: 123,268

[22] Filed: Feb. 21, 1980

Related U.S. Application Data

[62] Division of Ser. No. 876,113, Feb. 8, 1978, Pat. No. 4,218,531.

[51] Int. Cl.³ .................... G03C 1/68; C08F 8/18; C08F 8/34
[52] U.S. Cl. ................... 252/182; 204/159.11; 204/159.18; 204/159.24; 430/280; 430/281
[58] Field of Search ............ 252/182, 431 R, 431 P; 430/280, 281; 204/159.11, 159.16, 159.18, 159.24

[56] References Cited

U.S. PATENT DOCUMENTS

| | | | |
|---|---|---|---|
| 4,058,400 | 11/1977 | Crivello | 204/159.11 |
| 4,058,401 | 11/1977 | Crivello | 430/280 |
| 4,069,054 | 1/1978 | Smith | 430/270 |
| 4,108,747 | 8/1978 | Crivello | 430/281 |
| 4,138,255 | 2/1979 | Crivello | 430/280 |
| 4,156,035 | 5/1979 | Tsao et al. | 430/281 |

*Primary Examiner*—Benjamin R. Padgett
*Assistant Examiner*—Irwin Gluck
*Attorney, Agent, or Firm*—Cruzan Alexander; Donald M. Sell

[57] ABSTRACT

The use of certain organic materials having non-aromatic carbon-carbon unsaturation is described in connection with photopolymerizable compositions containing aromatic sulfonium complex salt photoinitiators in order to minimize or eliminate the odor of organosulfur reaction by-products.

6 Claims, No Drawings

CONTROLLING ODOR IN PHOTOPOLYMERIZATION

This is a division of application Ser. No. 876,113, filed Feb. 8, 1978 now U.S. Pat. No. 4,218,531.

BACKGROUND OF THE INVENTION

This invention relates to photopolymerizable compositions.

The use of aromatic sulfonium complex salts as photoinitiators for the polymerization of epoxides and other cationically polymerizable materials has been described, for example, in U.S. Pat. Nos. 4,058,400 and 4,058,401. Although for many applications such photopolymerizable compositions produce very satisfactory products, under certain conditions such compositions may emit an offensive odor which is characteristic of certain organosulfur compounds. Accordingly, the presence of such an odor effectively inhibits the use of coated substrates in areas such as food applications.

SUMMARY OF THE INVENTION

In accordance with the present invention there is provided a photopolymerizable composition comprising:
(a) a first organic material containing epoxide functionality and being polymerizable to higher molecular weight;
(b) aromatic sulfonium complex salt, said salt being photodecomposable and being capable of initiating polymerization of said organic material upon exposure to actinic radiation; and
(c) a second organic material containing at least one site of non-aromatic carbon-carbon unsaturation.

DETAILED DESCRIPTION OF THE INVENTION

The epoxides which are useful in the present invention are any organic compounds having an oxirane ring (i.e.

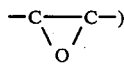

polymerizable by ring opening. Such materials, broadly called epoxides, include monomeric epoxy compounds and epoxides of the polymeric type and can be aliphatic, cycloaliphatic, aromatic or heterocyclic. These materials generally have, on the average, at least 1.5 polymerizable epoxy groups per molecule (preferably two or more epoxy groups per molecule). The polymeric epoxides include linear polymers having terminal epoxy groups (e.g. a diglycidyl ether of a polyoxyalkylene glycol), polymers having skeletal oxirane units (e.g. polybutadiene polyepoxide), and polymers having pendant epoxy groups (e.g. a glycidyl methacrylate polymer or copolymer). The epoxides may be pure compounds but are generally mixtures containing one, two, or more epoxy groups per molecule. The "average" number of epoxy groups per molecule is determined by dividing the total number of epoxy groups in the epoxy-containing material by the total number of epoxy molecules present.

These epoxy-containing materials may vary from low molecular weight monomeric materials to high molecular weight polymers and may vary greatly in the nature of their backbone and substituent groups. For example, the backbone may be of any type and substituent groups thereon can be any group free of an active hydrogen atom which is reactive with an oxirane ring at room temperature. Illustrative of permissible substituent groups are halogens, ester groups, ethers, sulfonate groups, siloxane groups, nitro groups, phosphate groups, etc. The molecular weight of the epoxy-containing materials may vary from 58 to about 100,000 or more. Mixtures of various epoxy-containing materials can also be used in the compositions of this invention.

Useful epoxy-containing materials include those which contain cyclohexene oxide groups such as the epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. For a more detailed list of useful epoxides of this nature, reference is made to the U.S. Pat. No. 3,117,099, incorporated herein by reference.

Further epoxy-containing materials which are particularly useful in the practice of this invention include glycidyl ether monomers of the formula

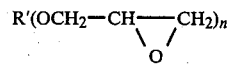

where R' is alkyl or aryl and n is an integer of 1 to 6. Examples are the glycidyl ethers of polyhydric phenols obtained by reacting a polyhydric phenol with an excess of chlorohydrin such as epichlorohydrin (e.g. the diglycidyl ether of 2,2-bis-(2,3-epoxypropoxyphenol)-propane). Further examples of epoxides of this type which can be used in the practice of this invention are described in U.S. Pat. No. 3,018,262, incorporated herein by reference, and in "Handbook of Epoxy Resins" by Lee and Neville, NcGraw-Hill Book Co., New York (1967).

There is a host of commercially available epoxy-containing materials which can be used in this invention. In particular, epoxides which are readily available include octacecylene oxide, epichlorohydrin, styrene oxide, vinyl cyclohexene oxide, glycidol, glycidylmethacrylate, diglycidyl ether of Bisphenol A (e.g. those available under the trade designations "Epon 828", "Epon 1004" and "Epon 1010" from Shell Chemical Co.; "DER-331", "DER-332", and "DER-334", from Dow Chemical Co.), vinylcyclohexene dioxide (e.g. "ERL-4206" from Union Carbide Corp.), 3,4-epoxycyclohexylmethyl-3,4-epoxycyclohexene carboxylate (e.g. "ERL-4221" from Union Carbide Corp.), 3,4-epoxy-6-methylcyclohexylmethyl-3,4-epoxy-6-methylcyclohexene carboxylate (e.g. "ERL-4201" from Union Carbide Corp.), bis(3,4-epoxy-6-methylcyclohexylmethyl) adipate (e.g. "ERL-4289" from Union Carbide Corp.), bis(2,3-epoxycyclopentyl) ether (e.g. "ERL-0400" from Union Carbide Corp.), aliphatic epoxy modified with polypropylene glycol (e.g. "ERL-4050" and "ERL-4052" from Union Carbide Corp.), dipentene dioxide (e.g. "ERL-4269" from Union Carbide Corp.), epoxidized polybutadiene (e.g. "Oxiron 2001" from FMC Corp.), silicone resin containing epoxy functionality, flame retardant epoxy resins (e.g. "DER-580", a brominated bisphenol type epoxy resin available from Dow Chemical Co.), 1,4-butanediol diglycidyl ether of phenolformaldehyde novolak (e.g. "DEN-431" and "DEN- 438" from Dow Chemical Co.), and resorcinol diglycidyl ether (e.g. "Kopoxite" from Koppers Company, Inc.).

Still other epoxy-containing materials are copolymers of acrylic acid esters of glycidol such as glycidylacrylate and glycidylmethacrylate with one or more copolymerizable vinyl compounds. Examples of such copolymers are 1:1 styreneglycidylmethacrylate, 1:1 methylmethacrylate-glycidylacrylate and a 62.5:24:13.5 methylmethacrylate-ethyl acrylate-glycidylmethyacrylate.

Other useful epoxy-containing materials are well known and include such epoxides as epichlorohydrins, e.g. epichlorohydrin; alkylene oxides, e.g. propylene oxide, styrene oxide; alkenyl oxides, e.g. butadiene oxide; glycidyl esters.

The compositions of the invention may also contain hydroxyl-containing material which is copolymerizable with the epoxy. The hydroxyl-containing material which is useful may be any liquid or solid organic material having hydroxyl functionality of at least 1, and preferably at least 2. Also, the hydroxyl-containing organic material is free of other oxirane-reactive "active hydrogens". The term "active hydrogen" is well known and commonly used in the art, and as used herein it generally corresponds to active hydrogen as determined by the method described by Zerewitinoff in J. Am. Chem. Soc., Vol. 49, 3181 (1927), incorporated herein by reference. Of course, the hydroxyl-containing material is also substantially free of groups which may be thermally or photolytically unstable; that is, the material will not decompose or liberate volatile components at temperatures below about 100° C., or in the presence of actinic radiation which may be encountered during the desired curing conditions for the photocopolymerizable composition.

Preferably the organic material contains two or more primary or secondary aliphatic hydroxyl groups (i.e. the hydroxyl group is bonded directly to a non-aromatic carbon atom). The hydroxyl groups may be terminally situated, or they may be pendent from a polymer or copolymer. The molecular weight (i.e. number average molecular weight) of the hydroxyl-containing organic material may vary from very low (e.g. 62) to very high (e.g. one million or more). The equivalent weight (i.e. number average equivalent weight) of the hydroxyl-containing material is preferably in the range of about 31 to 5000. When materials of higher equivalent weight are used they tend to reduce the rate and extent of copolymerization.

Representative examples of suitable organic materials having a hydroxyl functionality of 1 include alkanols, monoalkyl ethers of polyoxyalkyleneglycols, monoalkyl ethers of alkylene-glycols, and others known to the art.

Representative examples of useful monomeric polyhydroxy organic materials include alkylene glycols (e.g. 1,2-ethanediol, 1,3-propanediol, 1,4-butanediol, 2-ethyl-1,6-hexanediol, bis(hydroxymethyl)cyclohexane, 1,18-dihydroxyoctadecane, 3-chloro-1,2-propanediol), polyhydroalkanes (e.g. glycerine, trimethylolethane, pentaerythritol, sorbitol) and other polyhydroxy compounds such as N,N-bis(hydroxyethyl) benzamide, 2-butyne-1,4-diol, 4,4'-bis(hydroxymethyl)diphenyl-sulfone, caster oil, etc.

Representative examples of useful polymeric hydroxy-containing materials include polyoxyethylene and polyoxypropylene glycols and triols of molecular weights from about 200 to about 10,000, corresponding to equivalent weights of 100 to 5000 for the diols or 70 to 3300 for triols; polytetramethylene glycols of varying molecular weight; copolymers of hydroxypropyl and hydroxyethyl acrylates and methacrylates with other free radical-polymerizable monomers such as acrylate esters, vinyl halides, or styrene; copolymers containing pendent hydroxy groups formed by hydrolysis or partial hydrolysis of vinyl acetate copolymers, polyvinylacetal resins containing pendent hydroxyl groups; modified cellulose polymers such as hydroxyethylated and hydroxypropylated cellulose; hydroxy-terminated polyesters and hydroxy-terminated polylactones; and hydroxy-terminated polyalkadienes.

Useful commercially available hydroxyl-containing materials include the "Polymeg"]R series (available from Quaker Oats Company) of polytetramethylene ether glycols such as "Polymeg" 650, 1000 and 2000, "PeP" series (available from Wyandotte Chemicals Corporation) of polyoxyalkylene tetrols having secondary hydroxyl groups such as "PeP" 450, 550, and 650; "Butvar" series (available from Monsanto Chemical Company) of polyvinylacetal resins such as "Butvar" B-72A, B-73, B-76, B-90 and B-98; and "Formvar" 7/70, 12/85, 7/95S, 7/95E, 15/95S and 15/95E; "PCP" series available from Union Carbide) of polycaprolactone polyols such as "PCP" 0200, 0210, 0230, 0240, 0300; "Paraplex U-148" (available from Rhom and Haas), an aliphatic polyester diol, "Multron" R series (available from Mobay Chemical Co.) of saturated polyesters polyols such as "Multron" R-2, R-12A, R-16, R-18, R-38, R-68 and R-74; "Klucel E" (available from Hercules Inc.) a hydroxypropylated cellulose having an equivalent weight of approximately 100; and "Alcohol Soluble Butyrate" (available from Eastman Kodak) a cellulose acetate butyrate ester having a hydroxyl equivalent weight of approximately 400.

The amount of hydroxyl-containing organic material which may be used in the compositions of the invention may vary over broad ranges, depending upon factors such as the compatibility of the hydroxyl-containing material with the epoxide, the equivalent weight and functionality of the hydroxyl-containing material, the physical properties desired in the final cured composition, the desired speed of photocure, etc.

Generally speaking, with increasing amounts of hydroxyl-containing material in the composition the cured product exhibits improved impact resistance, adhesion to substrates, flexibility, and decreased shrinkage during curing, and correspondingly there is a gradual decrease in hardness, tensile strength and solvent-resistance.

Although both mono-functional and poly-functional hydroxyl-containing materials provide desirable results in the compositions of the invention, use of the poly-functional hydroxyl-containing materials is highly preferred for a majority of applications, although the mono-functional hydroxyl-containing materials are particularly effective in providing low viscosity, solvent-free coating compositions. When using hydroxyl-containing organic materials having a functionality significantly less than 2 (e.g. 1 to 1.5), amounts greater than about 0.2 equivalent of hydroxyl per equivalent of epoxy tend to provide cured compositions which are generally low in internal strength and tensile strength and are susceptible to solvent attack, and consequently may be unsuitable for many applications. This tendency becomes increasingly more apparent with increasing equivalent weight of the hydroxyl-containing material. Accordingly, when using mono-functional hydroxy materials it is preferred that the equivalent weight thereof be no greater than about 250.

When poly-functional hydroxyl-containing material is used it may be used in any amount, depending upon the properties desired in the cured composition. For example, the ratio of equivalents of hydroxyl-containing material to equivalents of epoxide may vary from about 0.001/1 to 10/1. For applications where one primarily desires flexibilization of an epoxy resin (e.g. for protective coatings on metal) ratios as low as 0.001/1 provide improved results. For applications where the epoxide is present primarily as an insolubilizing agent for a polyhydroxy-containing film-forming theremoplastic organic material (e.g. coatings for printing plates), ratios of hydroxyl equivalents to epoxide equivalents may be as high as 10/1. Generally speaking, the higher the hydroxyl equivalent weight the more effective such material is in imparting a given degree of toughness and flexibility to the cured composition.

Mixtures of hydroxyl-containing materials may be used, when desired. For example, one may use mixtures of two or more poly-functional hydroxy-materials, one or more mono-functional hydroxy materials with polyfunctional hydroxy materials, etc.

The complex salts which are useful in this invention can be prepared using conventional techniques described in the literature. For example, the aromatic sulfonium complex salts can be made by the procedure shown in J. W. Knapczyk and W. E. McEwen, J. Am. Chem. Soc., 91, 145, (1969); A. L. Maycock and G. A. Berchtold, J. Org. Chem. 35, No. 8, 2532 (1970); H. M. Pitt, U.S. Pat. No. 2,807,648, E. Goethals and P. De Radzetzky, Bul. Soc. Chim. Bleg., 73 546 (1964); H. M. Leicester and F. W. Bergstrom, J. Am. Chem. Soc., 51 3587 (1929), etc.

The useful complex salts are those of the formula

where R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure selected from aliphatic radicals and aromatic radicals, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3, d+e−f, f=valence of M and is an integer equal to from 2 to 7 inclusive, e is greater than f and is an integer having a value up to 8.

Particularly preferred complex salts are those in which M is boron, phosphorus, arsenic, or antimony, and particularly those in which the anion is $BF_4^-$, $PF_6^-$, $SbF_6^-$ or $AsF_6^-$. Anions which are slightly hydrolyzed, e.g. $SbF_5OH^-$, are considered to be the full equivalent of the unhydrolyzed form of the anion for the purposes of this invention.

The second organic material which is included in the compositions of the invention is of the type which has at least one site of non-aromatic carbon-carbon unsaturation. The material is soluble in the polymerizable composition and does not deleteriously affect the polymerization of such composition. The preferred organic materials are of the type in which the unsaturation is a carbon-carbon double bond wherein at least one of the carbon atoms is bonded to a

C=O group and in which neither of said carbon atoms is bonded to more than one hydrogen atom. The most preferred organic materials is that of the type wherein the carbon atom which is not bonded to the

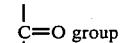

C=O group is bonded to an aromatic radical.

Representative useful organic materials include

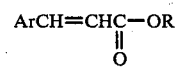

ArCH=CHC—OR
‖
O where Ar is an aromatic radical such as phenyl, chlorophenyl, naphthyl and the like, R is hydrogen or lower alkyl, benzyl, chloroalkyl, etc.;

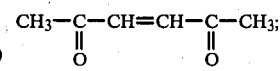

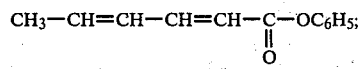

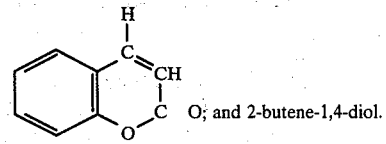

and 2-butene-1,4-diol.

The amount of such organic material present in the photopolymerizable compositions is not critical, it generally being present in an amount ranging from about 0.5 to 20% by weight of the polymerizable composition. Preferably such material is present in an amount of about 1 to 10% by weight. Generally, the amount of such material present is about 0.5 to 3 times as great as the amount of complex salt photoinitiator present.

For convenience, it is possible to prepare a photoinitiator concentrate consisting essentially of hydroxyl-containing material, complex salt photoinitiator, and the second organic material, in such proportions that the composition may be simply diluted with epoxy resin to form photopolymerizable coating compositions. For these purposes the preferred class of hydroxyl-containing materials are normally liquid oxyethylene-containing materials of the formula:

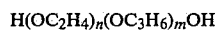    I where n+m is in the range of 2 to about 25, and wherein the oxyethylene units in such compounds constitute at least 15% by weight of such compounds. It is not necessary for all of the oxyethylene, or oxypropylene, units to be grouped together in any of the oxyethylene-containing materials described herein which are identified by formulas I, II and III. In other words, no particular order is required for such units in the compounds described in this specification. Accordingly, the compounds may be a block copolymer or random copolymer when m is greater than zero. In formula I above it is most preferred that m is equal to zero and that the average value of n is in the range of 2 to 4. It is also preferred that the viscosity of the compound be less than 250 cps. Representative of the preferred compounds of this formula are $HOC_2H_4OC_2H_4OH$, $H(OC_2H_4)_3OH$, $H(OC_2H_4)_4OH$, $HOC_2H_4OC_3H_6OH$, $HOC_2H_4(OC_3H_6)_2OH$, $H(OC_2H_4)_4(OC_3H_6)_6OH$, and $H(OC_2H_4)_{22}OH$.

Another class of useful oxyethylene containing compounds is that of the formula $$R[(OC_2H_4)_n(OC_3H_6)_mOH]_p \qquad II$$

where R is a polyvalent neutral linking organic radical. The term "neutral" means that the radical is essentially free of basic and acidic groups (i.e. free of groups which have a base strength equal to or greater than the amino group of aniline, and free of groups which have an acidity equal to or greater than phenol). Preferably R has less than about 25 carbon atoms and most preferably is a hydrocarbyl radical which may be aromatic, aliphatic or cyclic, although neutral substituents such as $NO_2$, halogen, oxo, alkoxy, aliphatic hydroxyl, etc. are permissible. R may contain skeletal carbon-bonded oxygen or sulfur atoms bonded only to carbon. The valence of R is equal to p, which may range from 2 to 6. The sum of n and m is in the range of 1 to about 25. The oxyethylene units in such compounds constitute at least about 15% by weight of such compounds, and the number of carbon atoms in R divided by the product of n and p is less than three. Preferably, m is equal to zero and the average value of n is 2 to 6. Representative examples of these compounds include $C_3H_5](OC_2H_4)OH]_3$, $C_3H_5[(OC_2H_4)_2OH]_3$, $C_4H_8[(OC_2H_4)_4OH]_2$, and $C_6H_4[C_2H_4(OC_2H_4)_3 (OC_3H_6)_3OH]_2$. Mixtures of materials with varying molecular weight, and of materials containing varying oxyethylene and oxypropylene content are useful, generally typify commercially available materials, and are sometimes preferred to decrease the melting point of pure materials.

Another class of useful oxyethylene-containing compounds is that of the formula $$R^1(OC_2H_4)_n(OC_3H_6)_mOH \qquad III$$

where $R^1$ is a monovalent neutral organic radical. The term "Neutral" has the same meaning as defined above. Preferably $R^1$ has less than about 25 carbon atoms and most preferably is a hydrocarbyl radical which may be aromatic, aliphatic or cyclic, although neutral substituents such as $NO_2$, halogen, oxo, alkoxyl. R may contain skeletal oxygen or sulfur atoms bonded only to carbon. The sum of n and m is in the range of 1 to about 20. The oxyethylene units in such compounds constitute at least about 50% by weight of such compounds. Preferably, m is equal to zero and the average value of n is 1 to 6. Representative examples of these compounds include $CH_3(OC_2H_4)_2OH$, $C_6H_{13}(OC_2H_4)_5(OC_3H_6)_3$, $C_5H_9C_6H_4(OC_2H_4)_{10}OH$, and $ClC_4H_8(OC_2H_4)_8OH$.

EXAMPLE 1

A liquid solution is prepared containing a triarylsulfonium hexafluorophosphate complex salt photoinitiator dissolved in diethylene glycol at a concentration of 10% by weight.

The complex salt is prepared using as starting material a triarylsulfonium chloride prepared in accordance with the procedure of example 10 of U.S. Pat. No. 2,807,648 (Pitt), incorporated herein by reference. The product is dissolved in methyl alcohol, the solution is filtered, and the filtrate is evaporated to leave a purified pale yellow crystalline product. A solution of 8.95 parts of this product in 15 parts of water is added to a solution of 5.52 parts of $KPF_6$ in 50 parts of water, with stirring, a copious precipitate forming. After stirring for 10 minutes, there are added 40 parts by methylene chloride to dissolve the precipitate. The methylene chloride phase is separated and washed twice with 20 parts of water each time. The methylene chloride phase is then dried by adding thereto 0.5 part of anhydrous magnesium sulfate which is thereafter removed by filtration. An equal weight of acetone is added to the methylene chloride solution to form a 12% by weight solution of triarylsulfonium hexafluorophosphate complex salt.

While the complex salt can be recovered, for example, by drying under reduced pressure until solvent has evaporated, it is generally more convenient to maintain it in solution form. Diethylene glycol, $HO(C_2H_4O)_2H$, 16 parts, is added to 17 parts of the above solution of complex salt. The resulting solution is placed in a rotary evaporator and heated to 40°-50° C. The pressure is slowly reduced to about 10 torr until the bulk of the methylene chloride and acetone is removed, then further reduced to about 1 torr until evaporation essentially ceases. A crystal clear amber liquid (of complex salt dissolved in diethylene glycol) is obtained in which the complex salt is about 10% by weight.

EXAMPLES 2-3

Two photopolymerizable epoxy compositions are prepared, one of such compositions containing an organic material having at least one site of non-aromatic carbon-carbon unsaturation. The formulations of these two compositions are as follows:

| Example | Ingredients | Parts |
|---|---|---|
| 2 | Solution of Example 1 | 20 |
|  | Epoxy resin ("ERL-4221") | 80 |
|  | Surfactant | 0.5 |
| 3 | Solution of Example 1 | 20 |
|  | Epoxy resin ("ERL-4221") | 77.5 |
|  | Surfactant | 0.5 |
|  | trans-4-phenyl-3-butene-2-one | 2.5 |

The nonionic surfactant which is present in the two examples is used merely to facilitate uniform spreading of the compositions on polyester film which is the substrate to be coated in these examples. The presence of a surfactant in these compositions is not always required, and many conventional surfactants, fluorine-containing and fluorine-free, are suitable for use.

A section of polyester film is coated in side-by-side strips with the two photopolymerizable compositions described above at a wet thickness of about 10 microns using a quadragravure handproofer. The so-coated film is then passed through an ultra-violet light processor (Model QC 1202; Radiation Polymer Company) with two standaard medium pressure 200 watts/inch mercury vapor lamps at a speed of 30 meters per minute.

The coating of Example 2, after exposure, exhibits a pronounced organo-sulfur odor; whereas, the cured coating of Example 3 exhibits no detectable odor. It is also observed that the composition of Example 3 exhibited a slightly more yellow color than the composition of Example 2 prior to curing, but after curing the composition of Example 3 exhibited less yellow color than that of Example 2.

EXAMPLES 4–6

Example 3 is repeated using other unsaturated organic materials of the type, and in the amounts, listed in the following table; in each example the total weight of epoxy plus unsaturated material is 80 parts.

| Example | Unsaturated Material | Parts |
|---------|----------------------|-------|
| 4 | 2-butene-1,4-diol | 5 |
| 5 | " | 10 |
| 6 | diallyl phthalate | 20 |

Each composition, after photo curing, exhibits little or no detectable organo-sulfur odor.

EXAMPLES 7–22

Several photopolymerizable compositions are prepared illustrating the use of various types of unsaturated organic materials for the purposes of reducing or eliminating organo-sulfur odor upon photo curing of such compositions. In each example the composition consists of the ingredients used in Example 3, except that the particular unsaturated organic material used, and the amount thereof, is that listed in the following table; in each example the total weight of epoxy plus unsaturated material is 80 parts.

| Example | Unsaturated Material | Parts |
|---------|----------------------|-------|
| 7 | 1,5-diphenyl-3-pentadienone | 10 |
| 8 | 1,5-diphenyl-3-pentadienone | 5 |
| 9 | trans-4-phenyl-3-butene-2-one | 5 |
| 10 | trans-4-phenyl-3-butene-2-one | 2 |
| 11 | cinnamyl maleate | 10 |
| 12 | cinnamic acid | 5 |
| 13 | methyl cinnamate | 5 |
| 14 | ethyl cinnamate | 5 |
| 15 | ethyl cinnamate | 2.5 |
| 16 | ethyl cinnamate | 2 |
| 17 | ethyl cinnamate | 1.5 |
| 18 | butyl cinnamate | 5 |
| 19 | butyl cinnamate | 2 |
| 20 | coumarin | 5 |
| 21 | 6-methyl-coumarin | 5 |
| 22 | 6-methyl-coumarin | 2 |

What is claimed is:

1. A liquid composition consisting essentially of:
   (a) aromatic sulfonium complex salt, said salt being photodecomposable and being capable of initiating polymerization of cationically polymerizable monomers upon exposure to actinic radiation;
   (b) at least about 15% by weight of liquid neutral oxyethylene-containing material selected from:
   (i) compounds having the formula $R[(OC_2H_4)_n(OC_3H_6)_mOH]_p$ where R is a polyvalent neutral organic radical having a valence of p, n+m is in the range of 1 to about 25, p is in the range of 2 to 6, wherein the oxyethylene units in such compounds constitute at least about 15% by weight of such compounds; and wherein the number of carbon atoms in R divided by the product of n and p is less than three; and
   (ii) compounds having the formula:

$R^1(OC_2H_4)_n(OC_3H_6)_mOH$ where $R^1$ is monovalent neutral organic radical, where n+m is in the range of 1 to 25, wherein the oxyethylene units in such compounds constitute at least about 50% by weight of such compounds; and
   (iii) compounds of the formula:

$H(OC_2H_4)_n(OC_3H_6)_mOH$ where n+m is in the range of 2 to about 25, wherein the oxyethylene units in such compounds constitute at least about 15% by weight of such compounds; and
   (c) an organic material containing at least one site of non-aromatic carbon-carbon unsaturation; wherein said unsaturation in said organic material is ethylenic and wherein each ethylenically unsaturated carbon atom has no more than one hydrogen atom bonded thereto; and wherein said organic material is present in an amount of about 0.5 to 20% by weight of said composition.

2. A liquid composition in accordance with claim 1, wherein at least one of said ethylenically unsaturated carbon atoms has bonded thereto a C=O group.

3. A liquid composition in accordance with claim 1, wherein said complex salt is of the formula $[(R)_a(R^1)_b(R^2)_cS]_d^+[MQ_e]^{-(e-f)}$ where R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure selected from aliphatic radicals and aromatic radicals, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3, d=e−f, f is equal to the valence of M and is an integer equal to from 2 to 7 inclusive, e is greater than f and is an integer having a value up to 8.

4. A liquid composition in accordance with claim 3, wherein a is equal to 3, M is selected from P or Sb, and Q is F.

5. A liquid composition in accordance with claim 1, wherein said oxyethylene-containing material is selected from $H(OC_2H_4)_2OH$, $H(OC_2H_4)_3OH$, $H(OC_2H_4)_4OH$, $HOC_2H_4OC_3H_6OH$, $HOC_2H_4(OC_3H_6)_2OH$, $H(OC_2H_4)_4(OC_3H_6)_6OH$ and $H(OC_2H_4)_{22}OH$.

6. A liquid composition in accordance with claim 1, wherein said oxyethylene-containing material is selected from $C_3H_5[(OC_2H_4)OH]_3$, $C_3H_5[(OC_2H_4)_2OH]_3$, $C_4H_8[(OC_2H_4)_4OH]_2$, and $C_6H_4[C_2H_4(OC_2H_4)_3(OC_3H_6)_3OH]_2$.

* * * * *

UNITED STATES PATENT AND TRADEMARK OFFICE
CERTIFICATE OF CORRECTION

PATENT NO. : 4,324,679

DATED : April 13, 1982

INVENTOR(S) : Robert C. Carlson

It is certified that error appears in the above—identified patent and that said Letters Patent is hereby corrected as shown below:

Column 2, line 38, replace "NcGraw-Hill" with --- McGraw-Hill ---.

Column 2, line 43, replace "octacecylene" with --- octadecylene---.

Column 3, line 10, replace "acrylate-glycidylmethyacrylate" with --- acrylate-glycidylmethacrylate ---.

Column 3, line 60, replace "polyhydroalkanes" with --- polyhydroxyalkanes ---.

Column 4, line 15, replace ""Polymeg"]R" with --- "Polymeg" R ---.

Column 4, lines 29-30, replace "polyesters" with --- polyester ---.

Column 5, lines 13-14, replace "theremoplastic" with --- thermoplastic ---.

Column 6, line 37, "and 2-butene-1,4-diol" should be deleted from the line in the formula.

Column 7, line 3, "In the formula I" should begin a new paragraph.

Column 7, lines 36-37, replace "$C_3H_5](OC_2H_4)OH]_3$" with --- $C_3H_5[(OC_2H_4)OH]_3$ ---.

Column 8, line 63, replace "standaard" with --- standard ---.

Column 10, line 10, replace "1 to 25" with --- 1 to about 25 ---.

Signed and Sealed this

Thirteenth Day of July 1982

[SEAL]

Attest:

GERALD J. MOSSINGHOFF

Attesting Officer    Commissioner of Patents and Trademarks